United States Patent [19]
Choi

[11] Patent Number: 6,060,930
[45] Date of Patent: May 9, 2000

[54] DELAY CIRCUIT

[75] Inventor: Hong-Sok Choi, Seoul, Rep. of Korea

[73] Assignee: LG Semicon Co., Ltd., Cheongju, Rep. of Korea

[21] Appl. No.: 09/008,328

[22] Filed: Jan. 16, 1998

[30] Foreign Application Priority Data

Nov. 1, 1997 [KR] Rep. of Korea ....................... 97/57567

[51] Int. Cl.[7] .................................................... H03K 5/13
[52] U.S. Cl. ........................... 327/276; 327/262; 327/281
[58] Field of Search ..................................... 327/262, 261, 327/263, 264, 284, 285, 288, 564, 566, 276–278, 281, 534, 535, 537

[56] References Cited

U.S. PATENT DOCUMENTS

| | | | |
|---|---|---|---|
| 4,746,823 | 5/1988 | Lee | 327/262 |
| 4,786,824 | 11/1988 | Masuda | 327/263 |
| 5,028,824 | 7/1991 | Young | 327/262 |
| 5,175,452 | 12/1992 | Lupi et al. | 327/262 |
| 5,243,228 | 9/1993 | Maruyama et al. | 327/534 |
| 5,283,631 | 2/1994 | Koerner et al. | 327/393 |
| 5,416,436 | 5/1995 | Rainard | 327/270 |
| 5,428,310 | 6/1995 | Casper et al. | 327/262 |
| 5,672,996 | 9/1997 | Pyeon | 327/534 |
| 5,673,005 | 9/1997 | Pricer | 327/277 |
| 5,828,258 | 10/1998 | Ooishi et al. | 327/291 |
| 5,838,047 | 11/1998 | Yamauchi et al. | 327/537 |

*Primary Examiner*—Tuan T. Lam
*Attorney, Agent, or Firm*—Fleshner & Kim

[57] ABSTRACT

A delay circuit which is capable of maintaining a constant delay time. The circuit includes a plurality of first delay circuits connected in series and each having an inverter for inverting an input voltage signal, and a variable capacitor connected to an output terminal of the inverter.

20 Claims, 5 Drawing Sheets

DELAY CIRCUIT

BACKGROUND OF THE INVENTION

1. Field of the Invention

The present invention relates to a delay circuit, and in particular to an improved delay circuit which is capable of having a constant time with respect to an externally applied voltage.

2. Description of the Conventional Art

As shown in FIG. 1, the conventional delay circuit includes a plurality of series inverters IN1 through INn, and a plurality of NMOS transistors NM1' through NMn-1' the drains and sources of which are commonly connected with a ground voltage VSS, respectively.

Each of the inverters IN1 through INn includes a corresponding one of PMOS transistors PM1 through PMn and a corresponding one of NMOS transistors NM1 through NMn the gates of which are commonly connected in series between an externally applied voltage VCC and a ground voltage VSS, thus forming an input terminal, and the drains of which are commonly connected, thus forming an output terminal.

The operation of the conventional delay circuit will now be explained with reference to FIGS. 1 and 2.

First, when an input signal VI is transited from a low level to a high level, the NMOS transistor NM1 of the first inverter IN1 is turned on.

At this time, the transition time of the output signal from the inverter IN1 is determined based on a value which is obtained through a multiplication between an Effective On Resistance of the NMOS transistor NM1 and an Effective Capacitance of the output terminal, so that it is possible to output an output voltage VO delayed more than the input voltage VI using the above-described transition time.

Here, the effective capacitance of the output terminal of the inverter is a sum between the signal value from the MOS transistor of the first inverter IN1 and a gate capacitance from an inverter IN2 of the next circuit.

As shown in FIG. 2, in the conventional delay circuit, as the externally applied voltage VCC is decreased, the effective capacitance value maintains a predetermined level. In addition, since the Effective On Resistance is increased, the delay time is determined by the time constant RC, so that the delay time is increased because the Effective On Resistance is reverse-proportional to the difference between the electric potential difference Vgs between the gate and the source and a threshold voltage Vth. Therefore, as the externally applied voltage VCC is increased, the electric potential of the gate is increased, and the Effective On Resistance is decreased, so that the delay time is decreased.

This is, as the externally applied voltage VCC is increased, the delay time is decreased.

SUMMARY OF THE INVENTION

Accordingly, it is an object of the present invention to provide a delay circuit which overcomes the aforementioned problems encountered in the conventional art.

It is another object of the present invention to provide an improved delay circuit which is capable of maintaining a constant delay time.

To achieve the above objects, there is provided a delay circuit which includes a plurality of first delay circuits connected in series and each having an inverter for inverting an input voltage signal, and a variable capacitor connected to an output terminal of the inverter.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
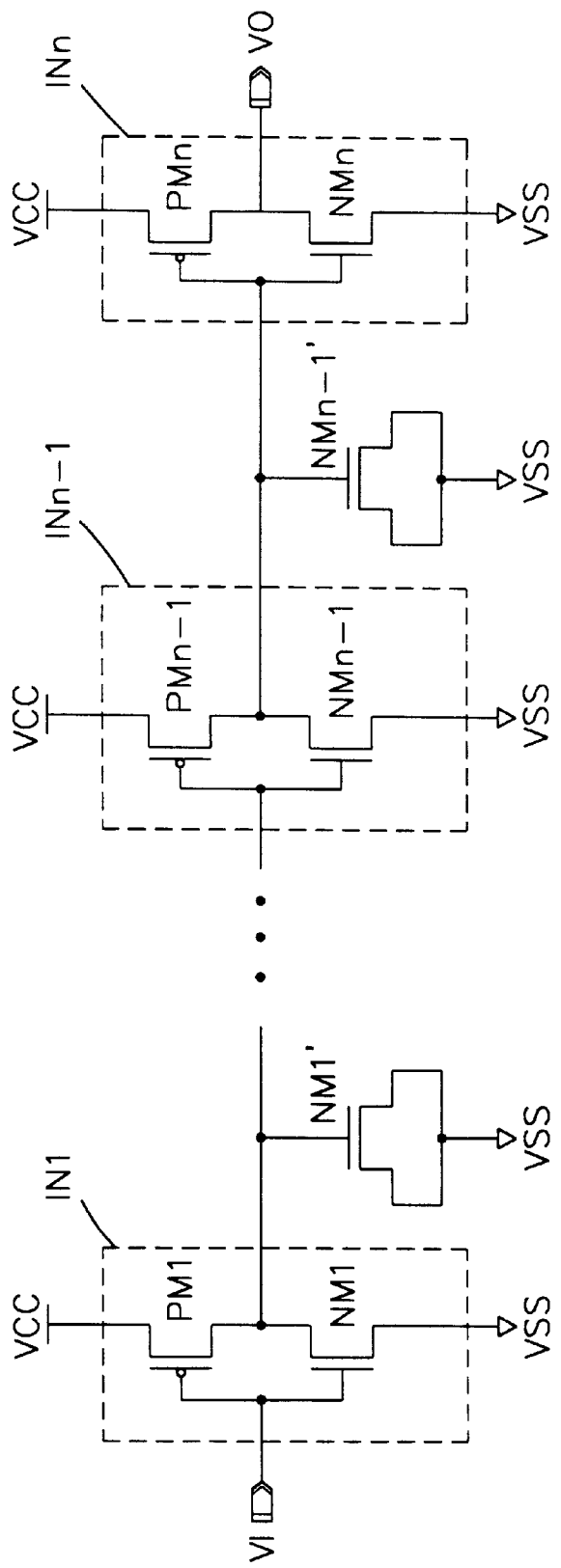
FIG. 1 is a circuit diagram illustrating a conventional delay circuit.
Figure 2:
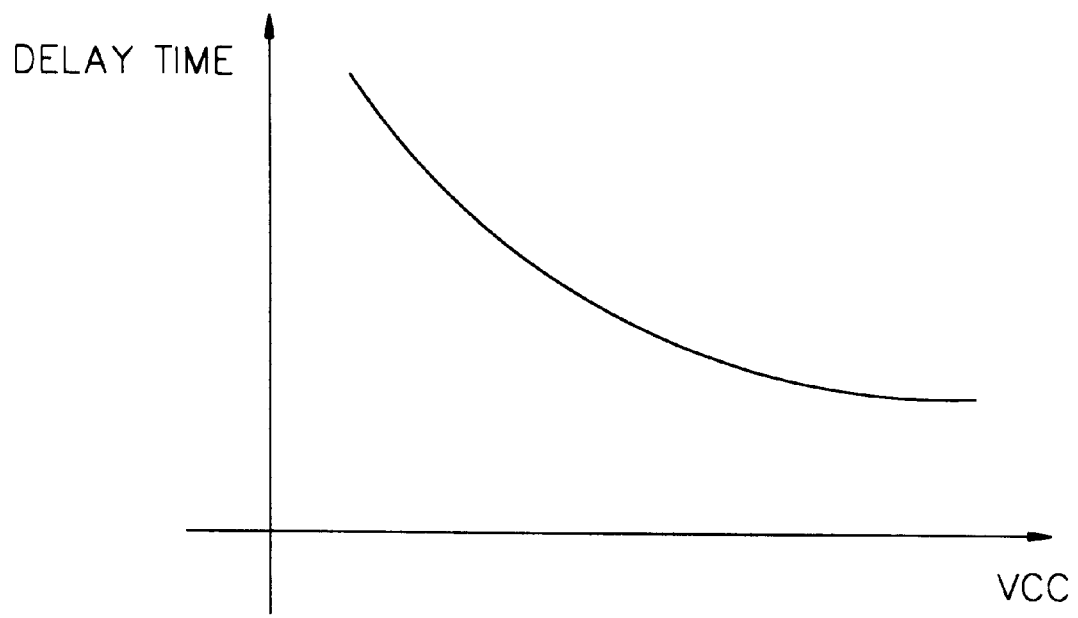
FIG. 2 is a graph illustrating an interrelationship between an external voltage and a delay time of the circuit of FIG. 1.
Figure 3:
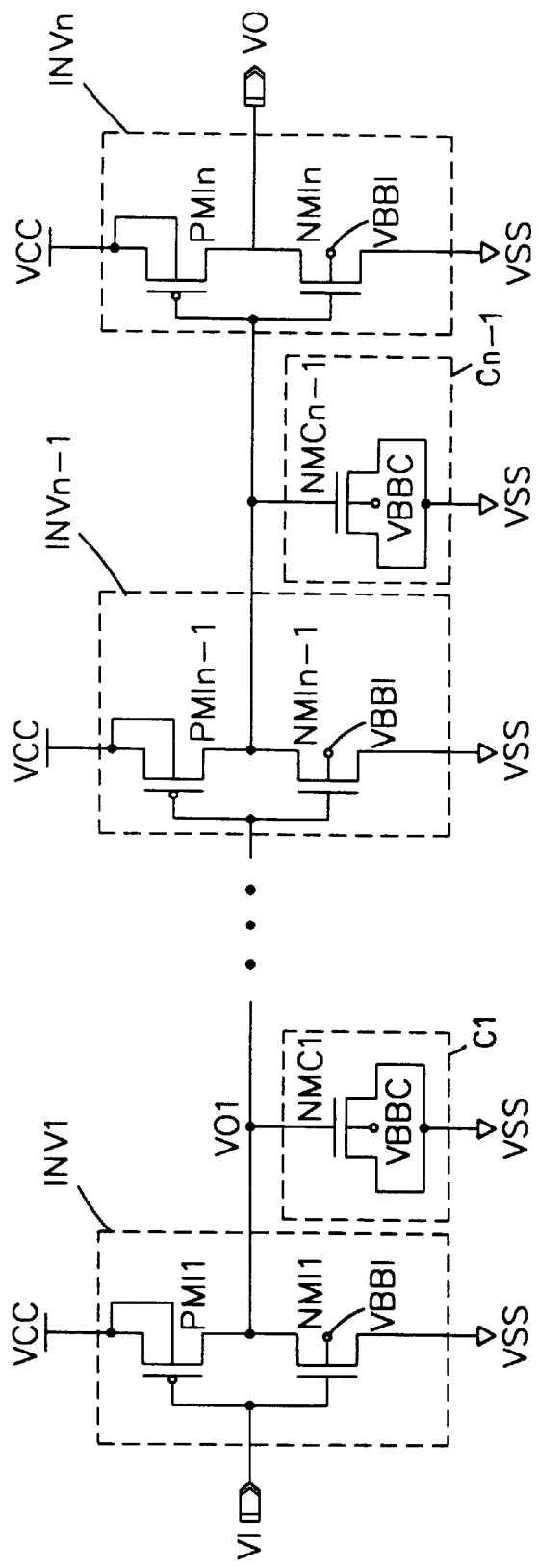
FIG. 3 is a circuit diagram illustrating a delay circuit according to the present invention.
Figure 4:
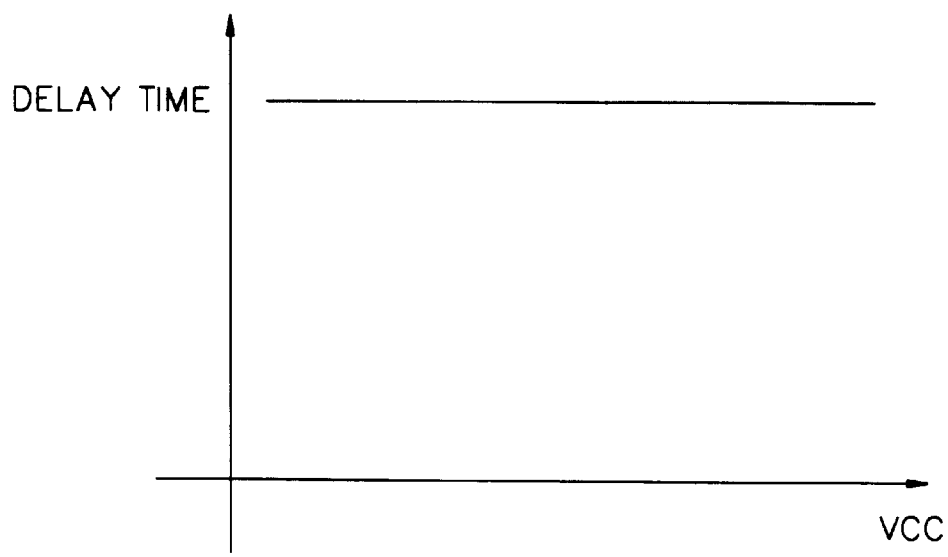
FIG. 4 is a graph illustrating an interrelationship between an external voltage and a delay time in the circuit of FIG. 3.
Figure 5:
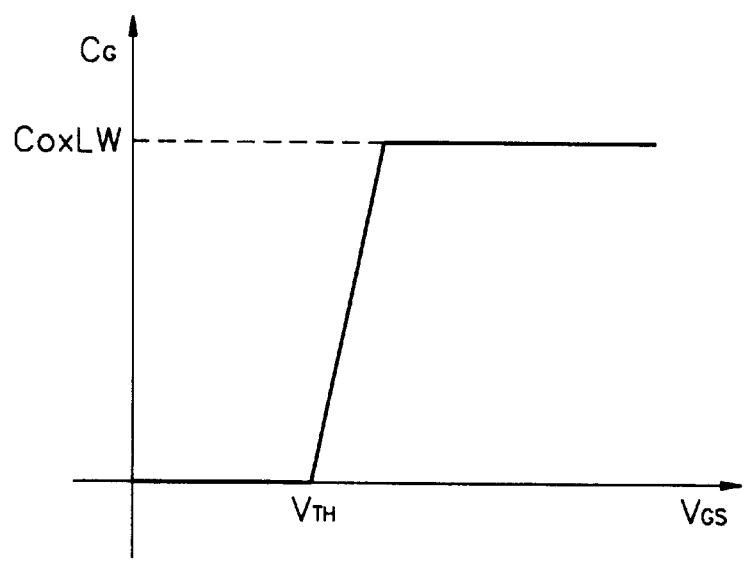
FIG. 5 is a graph illustrating an interrelationship between a gate-source voltage of a capacitor composed of an NMOS transistor and a capacitance.

As shown in FIG. 3, the delay circuit according to the present invention includes a plurality of inverters INV1 through INVn, and a plurality of NMOS transistors NMC1 through NMCn-1 each of the gates of which is connected to a corresponding one of the output terminals of the inverters INV1 through INVn, and the drains and sources are commonly connected with a ground voltage VSS, respectively, wherein a capacitance substrate voltage VBBC is applied to a substrate.

Here, the gates of the inverters INV1 through INVn are commonly connected for thus forming an input terminal, and the drains of the same are commonly connected for thus forming an output terminal. In addition, in each of the inverters INV1 through INVn, PMOS transistors PMI1 through PMIn, the sources of which are connected with the substrate, respectively, and NMOS transistors NMI1 through NMIn in which the inverter substrate voltage VBBI is connected with the substrate are connected in series between the externally applied voltage VCC and the ground voltage VSS.

The operation of the delay circuit according to the present invention will now be explained with reference to the accompanying drawings.

First, when an input signal IN is transited from a low level to a high level, the NMOS transistor NMI1 of the first inverter INV1 is turned on. At this time, the time which is required when the output signal from the inverter INV1 is transited is determined based on a value which is obtained through a multiplication between an Effective On Resistance of the NMOS transistor NMI1 of the inverter INV1 and an Effective capacitance of the output terminal, so that the output signal OUT is delayed using the thusly multiplied value, thus delaying a transition time.

Differently from the conventional art, in the present invention, a voltage VBBC is applied to the substrate of the NMOS transistors NMC1 through NMCn, respectively, of the capacitors C1 through Cn-1 for thus preventing a delay time which varies in accordance with a variation of the externally applied voltage VCC.

Therefore, since the capacitors C1 through Cn-1 composed of the NMOS transistors NMI1 through NMIn-1 each have a constant capacitance CoxLW when a voltage which exceeds the threshold voltage Vth is applied to the gates, respectively, when increasing the threshold voltage Vth by adjusting the capacitor substrate voltage VBBC which is applied to the substrate of the NMOS transistors NMC1 through NMCn-1 of the capacitor by using the above-described characteristic, the gate capacitances of the inverters INV2 through INVn of the next circuits become the Effective Capacitance of the inverter output terminal in a state that the delays by the capacitors C1 through Cn-1 do not occur when a lower externally applied voltage VCC is inputted. Therefore, it is possible to obtain a time constant (RC) delay time with respect to the Effective On Resistance which is increased when an externally applied lower voltage LOW VCC is inputted.

In addition, when a higher supply voltage HIGH VCC is inputted, since the externally applied voltage VCC is larger than the threshold voltages Vth of the capacitors C1 through Cn-1 composed of the NMOS transistors NMC1 through NMCn-1, the time constant (RC) delay time is maintained similarly to the lower supply voltage LOW VCC due to the Transistor On Resistance since the time constant (RC) delay and the capacitances Cg of the NMOS transistors NMC1 through NMCn-1 affect the same.

Figure 6:
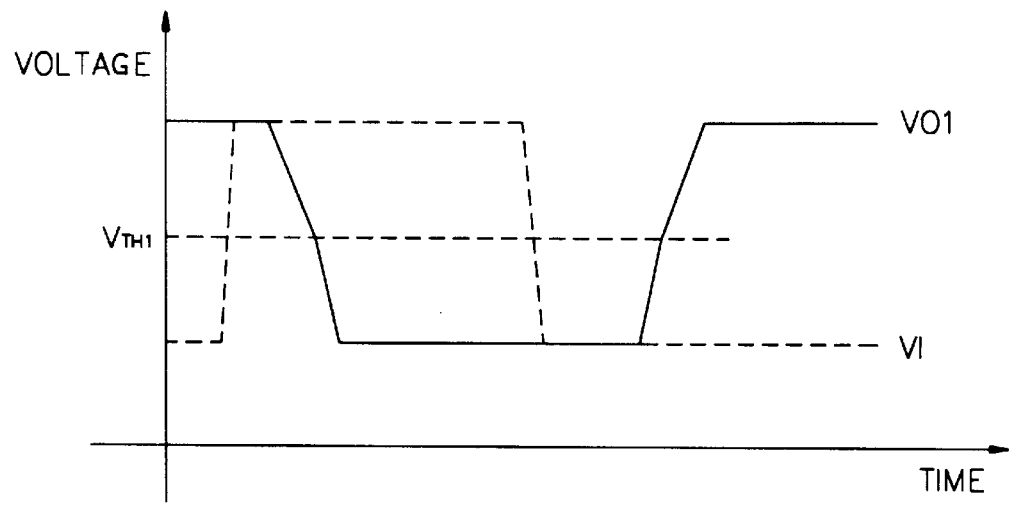
FIG. 6 is a graph illustrating an interrelationship between an input voltage and a first inverter output voltage.

FIG. 6 is a graph illustrating an interrelationship between an input voltage and a first inverter output voltage. As shown therein, when the output voltage VO1 is smaller than the threshold voltage Vth1 of the first NMOS transistor NMC1 of the first capacitor C1, the inclination is increased because the Effective Capacitance of the output terminal of the inverter INV1 is decreased.

Figure 7:
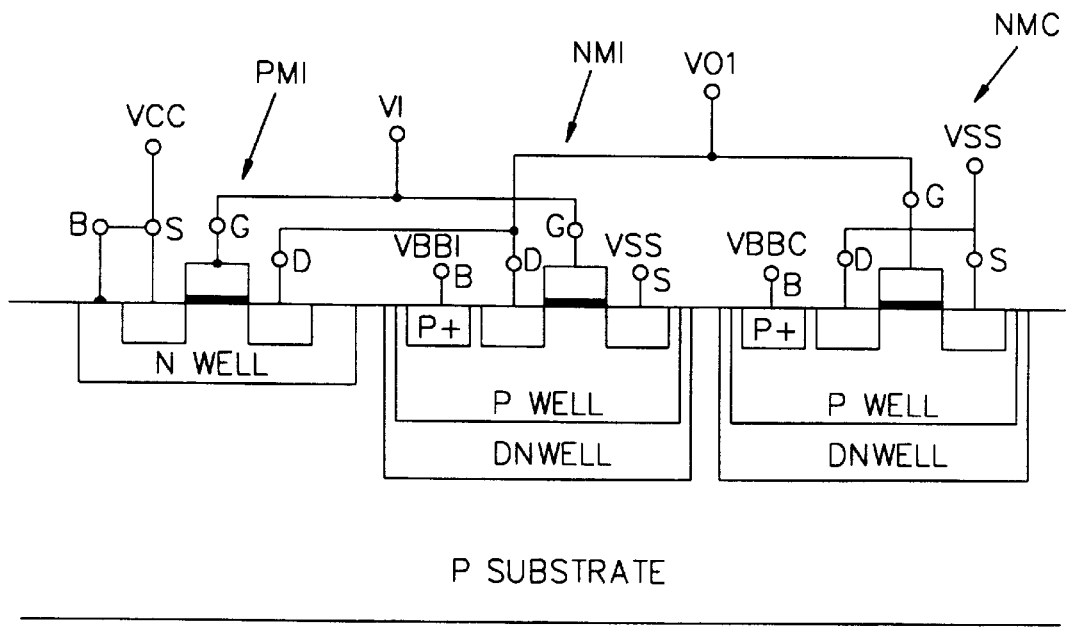
FIG. 7 is a cross-sectional view illustrating a delay circuit which is configured in a triple well structure according to the present invention.

FIG. 7 is a cross-sectional view illustrating a delay circuit which is configured in a triple well structure according to the present invention. As shown therein, a first p well P-WELL and first and second deep n wells DN WELL1 and DN WELL2 are formed in a p-type substrate. Second and third p wells are formed in the first and second deep n wells DN WELL1 and DN WELL2, respectively. In addition, a PMOS transistor of the inverter is formed in the first p well, and the first and second NMOS transistors of the inverter and capacitor are formed in the second and third p wells. First and second substrate voltages VBBI and VBBC are applied to the second and third p wells as shown in FIG. 7, so that the first delay circuit is implemented through the above-described construction.

Therefore, in the delay circuit according to the present invention, a predetermined voltage is differently applied to the substrates of the NMOS transistor of the inverter and the NMOS transistor of the capacitor, respectively, so that the substrates have different threshold voltages, thus obtaining a constant delay time irrespective of the variation of an externally applied voltage.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A circuit, comprising:
a plurality of delay circuits connected in series and each having an inverter for inverting an input voltage signal, and a variable capacitor for coupling to a ground potential and connected to an output terminal of the inverter, wherein the variable capacitor includes a transistor having a substrate for coupling to an adjustable voltage to modulate a capacitive value of the variable capacitor.

2. The circuit of claim 1, wherein the inverter comprises a PMOS transistor a source of which is connected with a first power voltage, and an NMOS transistor a drain of which is commonly connected with the PMOS transistor, thus forming an output terminal, and a source of which is connected with a second power voltage, the PMOS transistor and the NMOS transistor having gates commonly connected to form an input terminal.

3. The circuit of claim 2, wherein a substrate of said PMOS transistor is connected with a source of the PMOS transistor.

4. The circuit of claim 2, wherein the NMOS transistor includes a substrate having an electric potential different from that of the source of the NMOS transistor.

5. The circuit of claim 2, wherein said first and second power voltage are an externally applied voltage and a ground voltage, respectively.

6. The circuit of claim 5, wherein a substrate of said NMOS transistor has an electric potential different from that of the source of the NMOS transistor.

7. The circuit of claim 1, wherein said circuit is formed on a semiconductor substrate having a triple well structure.

8. The circuit of claim 1, further comprises a first potential coupled to each of the plurality of inverters, wherein the variable capacitor prevents a delay time that varies according to the first potential.

9. The circuit of claim 8, wherein the transistor of the variable capacitor includes a gate used as a first electrode, and a source and drain of which are commonly connected, thus forming a second electrode.

10. The circuit of claim 9, wherein the transistor is an NMOS transistor.

11. The circuit of claim 9, wherein each of the inverters includes
a first inverter transistor having first and second electrodes and a control electrode, the first electrode for coupling to a first voltage potential,
a second inverter transistor having first and second electrodes, and
a control electrode, the first electrode of the second inverter transistor being coupled to the second electrode of the first inverter transistor to form an output terminal, the second electrode of the second inverter transistor for coupling to a second voltage potential, and the control electrode of the second inverter transistor being coupled to the control electrode of the first inverter transistor to form an input terminal.

12. A delay circuit, comprising:
a plurality of inverters coupled in series; and
a variable capacitor including a variable transistor having
a first electrode coupled to an output of one of the inverters,
a source and drain commonly connected to form a second electrode for coupling to a ground potential, and
a substrate for coupling to a variable voltage to modulate a capacitive value of the variable capacitor.

13. The delay circuit of claim 12, wherein each of the inverters includes
 a first inverter transistor having first and second electrodes and a control electrode, the first electrode for coupling to a first voltage potential,
 a second inverter transistor having first and second electrodes, and
 a control electrode, the first electrode of the second inverter transistor being coupled to the second electrode of the first inverter transistor to form an output terminal, the second electrode of the second inverter transistor for coupling to a second voltage potential, and the control electrode of the second inverter transistor being coupled to the control electrode of the first inverter transistor to form an input terminal.

14. The delay circuit of claim 13, wherein a substrate of the first inverter transistor is coupled to the first electrode of the first inverter transistor for coupling to the first voltage potential.

15. The delay circuit of claim 13, wherein a substrate of the second inverter transistor is coupled to a third voltage potential different than the second voltage potential.

16. The delay circuit of claim 13, wherein the first and second potentials are an externally applied voltage and a ground voltage, respectively.

17. A delay circuit, comprising:
 series means for coupling a plurality of inverters in series, each inverter for coupling to a first potential; and
 means for preventing a delay time that varies according to the first potential, the means for preventing including,
  a transistor having a gate electrode, a source electrode, a drain electrode and a substrate,
  means for coupling the gate electrode to an output of one of the inverters,
  means for commonly connecting the source electrode and the drain electrode for coupling to a second potential, and
  means for modulating a capacitive value of the means for preventing by coupling a variable voltage to the substrate.

18. The delay circuit of claim 17, wherein each inverter includes:
 a first transistor having first and second electrodes, and a control electrode,
 means for coupling the first electrode to the first potential,
 a second transistor having first and second electrodes and a control electrode,
 means for coupling the first electrode of the second transistor to the second electrode of the first transistor to form an output terminal,
 means for coupling the second electrode of the second transistor to the second potential, and
 means for forming an input terminal by coupling the control electrode of the first transistor to the control electrode of the second transistor.

19. The delay circuit of claim 18, further comprising:
 means for coupling the first electrode of the first transistor with a substrate of the first transistor; and
 means for coupling a substrate of the second transistor to a third potential different than the second potential.

20. The delay circuit of claim 17, wherein the first and second potential are an externally applied voltage and a ground voltage, respectively.

* * * * *